United States Patent
Carlson et al.

(10) Patent No.: US 9,464,364 B2
(45) Date of Patent: Oct. 11, 2016

(54) THERMAL LOAD LEVELING DURING SILICON CRYSTAL GROWTH FROM A MELT USING ANISOTROPIC MATERIALS

(75) Inventors: Frederick M. Carlson, Postdam, NY (US); Brian T. Helenbrook, Potsdam, NY (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 870 days.

(21) Appl. No.: 13/292,410

(22) Filed: Nov. 9, 2011

(65) Prior Publication Data

US 2013/0112135 A1    May 9, 2013

(51) Int. Cl.
| | |
|---|---|
| *C30B 15/30* | (2006.01) |
| *C30B 29/06* | (2006.01) |
| *C30B 15/00* | (2006.01) |
| *C30B 15/06* | (2006.01) |
| *C30B 15/14* | (2006.01) |
| *C30B 15/22* | (2006.01) |

(52) U.S. Cl.
CPC ............ *C30B 29/06* (2013.01); *C30B 15/007* (2013.01); *C30B 15/06* (2013.01); *C30B 15/14* (2013.01); *C30B 15/22* (2013.01); *C30B 15/30* (2013.01); *Y10T 117/1024* (2015.01)

(58) Field of Classification Search
CPC ..... C30B 15/00; C30B 15/002; C30B 15/06; C30B 15/10; C30B 15/14; C30B 15/20; C30B 15/30; C30B 15/305; C30B 29/00; C30B 29/02; C30B 29/06; C30B 35/00; Y10T 117/00; Y10T 117/10; Y10T 117/1024; Y10T 117/1032; Y10T 117/1036; Y10T 117/1044; Y10T 117/1048; Y10T 117/1068; Y10T 117/1072
USPC .......... 117/11, 13, 26–27, 73, 200–203, 206, 117/208–209, 211–213, 217, 928, 931–932, 117/23–24, 30–31
See application file for complete search history.

(56) References Cited

U.S. PATENT DOCUMENTS

| | | | |
|---|---|---|---|
| 3,798,007 A | * | 3/1974 | Bochman ................ C30B 15/14 |
| | | | 117/217 |
| 4,226,834 A | | 10/1980 | Shudo et al. |
| 4,251,206 A | | 2/1981 | Berkman et al. |
| 4,316,764 A | | 2/1982 | Kudo et al. |

(Continued)

FOREIGN PATENT DOCUMENTS

| | | |
|---|---|---|
| WO | 2010051184 A2 | 5/2010 |
| WO | 2010056350 A2 | 5/2010 |

*Primary Examiner* — Kenneth A Bratland, Jr.

(57) ABSTRACT

An apparatus for growing a silicon crystal substrate comprising a heat source, an anisotropic thermal load leveling component, a crucible, and a cold plate component is disclosed. The anisotropic thermal load leveling component possesses a high thermal conductivity and may be positioned atop the heat source to be operative to even-out temperature and heat flux variations emanating from the heat source. The crucible may be operative to contain molten silicon in which the top surface of the molten silicon may be defined as a growth interface. The crucible may be substantially surrounded by the anisotropic thermal load leveling component. The cold plate component may be positioned above the crucible to be operative with the anisotropic thermal load leveling component and heat source to maintain a uniform heat flux at the growth surface of the molten silicon.

9 Claims, 6 Drawing Sheets

*Floating Silicon Method System 200*

(56) References Cited

U.S. PATENT DOCUMENTS

| | | | |
|---|---|---|---|
| 4,329,195 A * | 5/1982 | Kudo | C30B 15/002 117/27 |
| 4,599,132 A | 7/1986 | Jewett et al. | |
| 4,747,774 A * | 5/1988 | Piotrowski | C30B 15/10 117/211 |
| 7,855,087 B2 | 12/2010 | Kellerman et al. | |
| 2009/0233396 A1 * | 9/2009 | Kellerman | C30B 15/06 438/57 |

* cited by examiner

*Floating Silicon Method System 100*

Floating Silicon Method System 200

400

500

THERMAL LOAD LEVELING DURING SILICON CRYSTAL GROWTH FROM A MELT USING ANISOTROPIC MATERIALS

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

BACKGROUND OF THE INVENTION

1. Field of the Invention

Embodiments of the present disclosure relate to the field of silicon crystal growth. More particularly, the present invention relates to thermal load leveling using anisotropic materials to control silicon crystal growth.

2. Discussion of Related Art

Demand for solar cells continues to increase as the demand for renewable energy sources increases. As these demands increase, one goal of the solar cell industry is to lower the cost/power ratio. Solar energy in terms of $/watt is expensive due in part to the cost of manufacturing solar cells. There are two types of solar cells: silicon and thin film. The majority of solar cells are made from silicon wafers, such as single crystal silicon wafers which accounts for the majority of the cost associated with the manufacture of crystalline silicon solar cells. The efficiency of the solar cell, or the amount of power produced under standard illumination, is limited, in part, by the quality of this wafer. Currently, the production of these solar wafers can exceed 40% of the entire cost of a solar cell. Thus, providing high quality solar wafer production in a cost efficient manner can reduce the overall cost of solar energy. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Various embodiments are generally directed to silicon crystal growth for silicon wafer production used to manufacture solar cells. In one embodiment there is disclosed an apparatus for growing a silicon crystal substrate that includes a heat source, an anisotropic thermal load leveling component, a crucible, and a cold plate component. The crucible is operative to contain molten silicon in which a top surface of the molten silicon is defined as a growth interface. The anisotropic thermal load leveling component has a high thermal conductivity and is disposed between the heat source and the crucible. The anisotropic thermal load leveling component is operative to even-out temperature and heat flux variations emanating from the heat source. The cold plate component is positioned above the crucible to absorb heat from the molten silicon to crystallize the molten silicon into a silicon crystal substrate.

In another embodiment, a method of growing a silicon crystal substrate comprises filling a crucible with molten silicon in which a portion of the top surface of the molten silicon defines a growth surface. The crucible and the molten silicon within the crucible are heated using a heat source. The heat from the heat source incident on a surface of the crucible is regulated via a passive thermal load leveling anisotropic material disposed between the heat source and the crucible. A uniform heat flux at the growth surface of the molten silicon is maintained by cooling an area above the growth surface.

DESCRIPTION OF EMBODIMENTS

Figure 1:
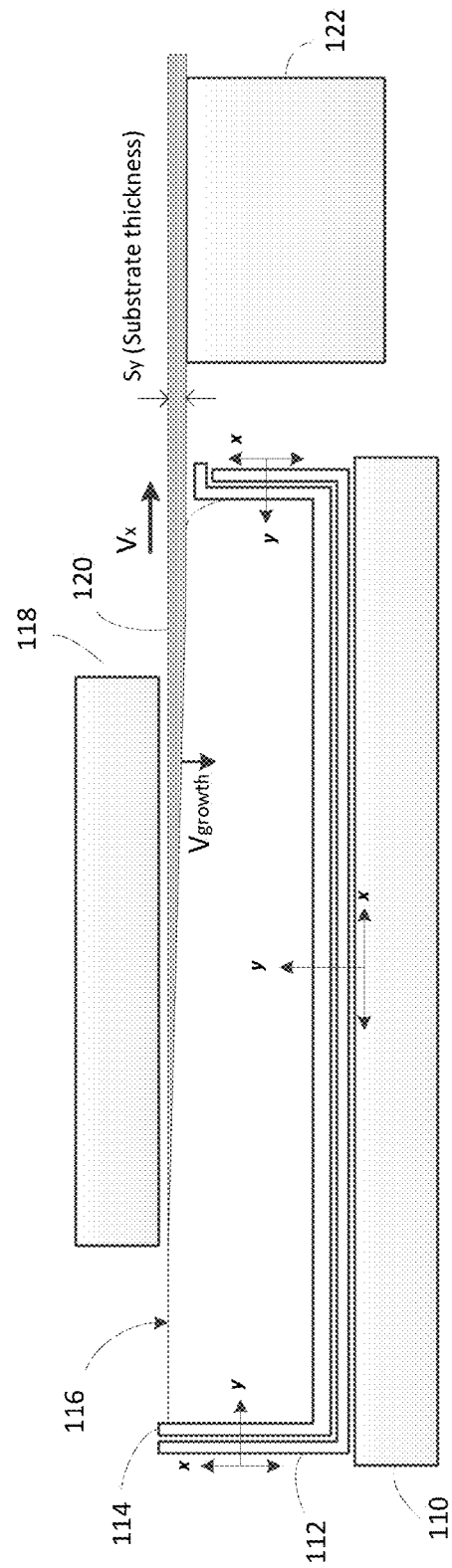
FIG. 1 illustrates a block diagram of an FSM apparatus according to an embodiment of the present disclosure.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Various embodiments are directed to a thermal load leveling component disposed between a heat source and a crucible containing molten silicon used in silicon wafer manufacturing to aid in leveling out temperature and heat flux variations produced by the heat source. In some embodiments, a pump apparatus and a baffle structure may also be utilized within the crucible to promote uniform flow of the molten silicon leading to further leveling of temperature and heat flux variations.

When growing silicon crystal substrates such as, for instance, silicon photovoltaic substrates for use in solar cells, a floating silicon method (FSM) may be used. By way of background, silicon crystal growth using FSM is similar to how ice forms on a pond when the air temperature drops below the freezing point for water. A solid ice surface will begin to form on the surface of the pond and "grow" downward over time into the warmer water based on the air temperature at the surface of the pond and the current water temperature.

FSM silicon crystal growth generally comprises a crucible filled with molten silicon that is heated from below and cooled from above. The cooling component causes the molten silicon to begin solidifying at its top surface which is referred to as the growth region. The silicon crystal substrate growth extends downward into the molten silicon. The growth rate of the silicon crystal is therefore dependent on the temperature of the molten silicon and the cooling component. As the silicon grows vertically downward, it is also pulled or transported in a horizontal direction out of the crucible and away from the heating and cooling sources. Through precise manipulation of temperature gradients affecting the molten silicon, the silicon crystal can grow at a constant rate and can be pulled or transported at a constant rate to ensure a relatively uniform thickness for the silicon crystal substrate. Thus, it is advantageous to maintain horizontally uniform temperature conditions in the growth region.

Optimally, the vertical growth rate should be as uniform as possible. This may be accomplished by maintaining a near constant vertical heat flux relative to the growth surface. The temperature at the top surface of the silicon crystal substrate should be maintained at a temperature that is less than the temperature of the growth surface in order to remove energy. The temperature difference should be relatively small so as to minimize stress within the silicon crystal substrate. Maintaining this condition may be troublesome, however, when the heat source experiences spatial temperature variations. In particular, the heat source used to heat the molten silicon may generate temperature gradients across the molten silicon. Introducing a thermal load leveling component at the proper point in an FSM system can significantly even-out temperature and heat flux variations present in the heat source and consequently the temperature of the molten silicon.

Generally, heat flux is the rate of heat energy transfer through a given surface. In the International System of Units (SI), heat flux is measured in ($W/m^2$) and is the rate of thermal energy transferred per unit area. The measurement of heat flux is most often done by measuring a temperature difference over a piece of material with known thermal conductivity which refers to a material's ability to conduct heat. Heat transfer across materials of high thermal conductivity occurs at a faster rate than across materials of low thermal conductivity. Materials of high thermal conductivity may be used in heat source applications. The SI derived unit of heat rate is joules per second, or watt. The heat rate is a scalar quantity, while heat flux is a vector quantity.

The thermal load leveling component used in an FSM system to even-out temperature and heat flux variations should be highly anisotropic since the heat energy is directed toward the molten silicon. Anisotropy is the property of being directionally dependent, as opposed to isotropy, which implies identical properties in all directions. Anisotropy can be defined as a difference, when measured along different axes, in a material's physical or mechanical properties including thermal conductivity. Temperature variations in the direction of high-thermal conductivity in an anisotropic material tend to be eliminated because there is rapid heat transfer in that direction. This can aid in leveling out temperature and heat flux variations caused by a non-uniform heat source. This leads to growth of more uniform, higher quality silicon crystal substrates used to manufacture solar cells or other devices.

FIG. 1 illustrates a block diagram of a floating silicon method (FSM) apparatus 100 according to an embodiment of the invention. The FSM apparatus 100 is generally directed to growing a silicon crystal substrate 120 from molten silicon 116. Apparatus 100 includes a heat source 110 which may be comprised of, for example, graphite. In one embodiment, a graphite heat source 110 may be approximately 2 mm thick and possess a thermal conductivity (k) value of approximately 4 watts per meter-kelvin (W/mK). A crucible 114 is adapted to contain the molten silicon 116 and may be comprised of quartz. In one exemplary embodiment, crucible 114 may be approximately 5 mm thick and possess a thermal conductivity (k) value of approximately 4 W/mK.

An anisotropic thermal load leveling component 112 is disposed between the heat source 110 and crucible 114. The anisotropic load leveling component 112 at least partially surrounds crucible 114 and may be comprised of pyrolytic graphite which is a highly anisotropic material. In pyrolytic graphite, carbon atoms form a structure that in one direction is characterized by planar layers of hexagonally arranged carbon atoms and in a direction perpendicular to the planar layers comprises randomly oriented atoms. This causes a high thermal conductivity (k) in the direction of the planar layers, but a very low thermal conductivity in the perpendicular direction. Pyrolytic graphite may also be characterized as a passive component because it requires no additional energy or control to obtain and maintain its anisotropic high thermal conductivity properties. In one embodiment, the pyrolytic graphite may be approximately 10 mm thick and possess a thermal conductivity (k) value of approximately 300 W/mK in the planar direction and only 1 w/mK in the perpendicular direction.

A cold plate component 118 such as, for instance, silicon carbide may be positioned above the crucible 114 to absorb heat from the molten silicon 116 such that a growth interface forms therebetween. This cold plate component 118 may absorb heat using radiative heat transfer or a combination of radiative and convective heat transfer, for example. The molten silicon 116 crystallizes and "grows" in a downward direction as symbolized by the $V_{growth}$ arrow in FIG. 1 to form a silicon crystal substrate 120. The heat flowing through the molten silicon 116 is radiated from the top surface to the cold plate component 118 which acts as a heat sink to the radiation. Thus, a lower cold plate temperature produces a larger growth rate $V_{growth}$ of the silicon crystal substrate 120 while for a given cold plate temperature a larger heat flow rate through the silicon produces a smaller growth rate $V_{growth}$. Thus, the growth rate value $V_{growth}$ is determined by a balance of the heat flow through the melt and the amount of heat absorbed by the cold plate component 118 from the molten silicon 116.

By way of an illustrative example, a 2 mm thick graphite heat source 110 having a thermal conductivity of 4 W/mK heats a 10 mm anisotropic thermal load leveling component 112 comprising a pyrolytic graphite material and having a thermal conductivity of 300 W/mK in the planar or "x" direction and 1 W/mK in the perpendicular or "y" direction. The "x" and "y" axes are labeled in FIG. 1 for the anisotropic thermal load leveling component 112. It should be noted that the "y" direction on any given point of the anisotropic thermal load leveling component 112 is always perpendicular to the surface of the crucible 114. The anisotropic thermal load leveling component 112 surrounds a 5 mm thick crucible 114 which may comprise a quartz material and have a thermal conductivity of 4 W/mK. The crucible 114 contains a 10 mm depth of molten silicon 116 having a thermal conductivity of 64 W/mK. A cold plate component 118 is positioned above the molten silicon 116 to create a growth interface at the top surface of the molten silicon 116 where the molten silicon 116 can begin to crystallize and "grow" into a silicon crystal substrate 120 in a downward direction as symbolized by the $V_{growth}$ arrow in FIG. 1.

For this example, the desired thickness ($S_y$ in FIG. 1) of the silicon crystal substrate is 100 μm. The cold plate draws a uniform heat flux of 10 kW/m² and the temperature of the molten silicon at the bottom of the crucible is 1687K assuming the growth interface is at the solidification temperature of silicon, 1685K. Based on the characteristics described above, the growth rate, $V_{growth}$, is 10 µm per second. Thus, the silicon crystal substrate will reach the desired thickness of 100 µm in 10 seconds. The pull-rate, $V_x$, should be approximately 2 cm/s to traverse the 20 cm growth area such that the silicon crystal substrate thickness ($S_y$) will be 100 µm when it is pulled or transported away from the growth interface and onto a support table 122 where it can be cut into sheets. In this manner, the anisotropic thermal load leveling component 112 keeps the heat flux to the growth interface horizontally uniform so that a uniform vertical growth rate and sheet thickness can be obtained. In an alternate embodiment, the substrate thickness ($S_y$) will be grown to slightly larger than 100 µm to compensate for any thickness loss due to the molten silicon as the silicon crystal substrate 120 is pulled or transported from the FSM apparatus 100. This may enable the silicon crystal substrate 120 to have a substrate thickness ($S_y$) of 100 µm when it reaches the support table 122.

Figure 2:
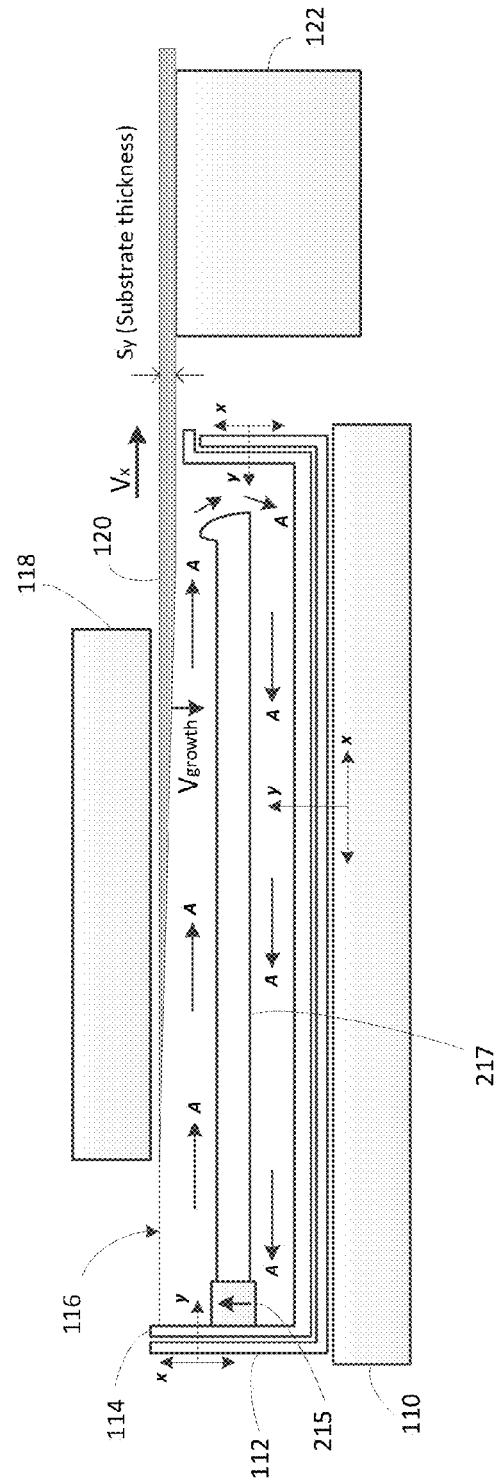
FIG. 2 illustrates a block diagram of an FSM apparatus according to another embodiment of the present disclosure.

FIG. 2 illustrates a block diagram according to an alternative embodiment of the present disclosure. The FSM apparatus 200 is substantially similar to that described with reference to FIG. 1 with the exception of a pump 215 and baffle structure 217. In particular, apparatus 200 includes an anisotropic thermal load leveling component 112 disposed between heat source 110 and crucible 114. Molten silicon 116 is deposited in crucible 114. The molten silicon 116 passes through pump 215 which is operative to cause the molten silicon 116 to flow about baffle structure 217 in a direction as indicated by arrows A. By causing the molten silicon within the crucible 114 to flow about baffle structure 217, the thermal gradient variations can be further reduced. Consequently, the reduction in thermal gradient variations of the molten silicon 116 within crucible 114 provides for more consistent crystallization using cold plate component 118. In this manner, higher quality silicon substrates are produced in a more cost efficient and reliable manner. In addition, the constant flow serves to substantially uniformly disperse any impurities within the molten silicon such that there are no isolated occurrences of high concentrations of impurities that end up in the finished product.

Included herein is one or more flow charts representative of exemplary methodologies for performing novel aspects of the disclosed structure. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. Moreover, not all acts illustrated in a methodology may be required for a novel implementation.

Figure 3:
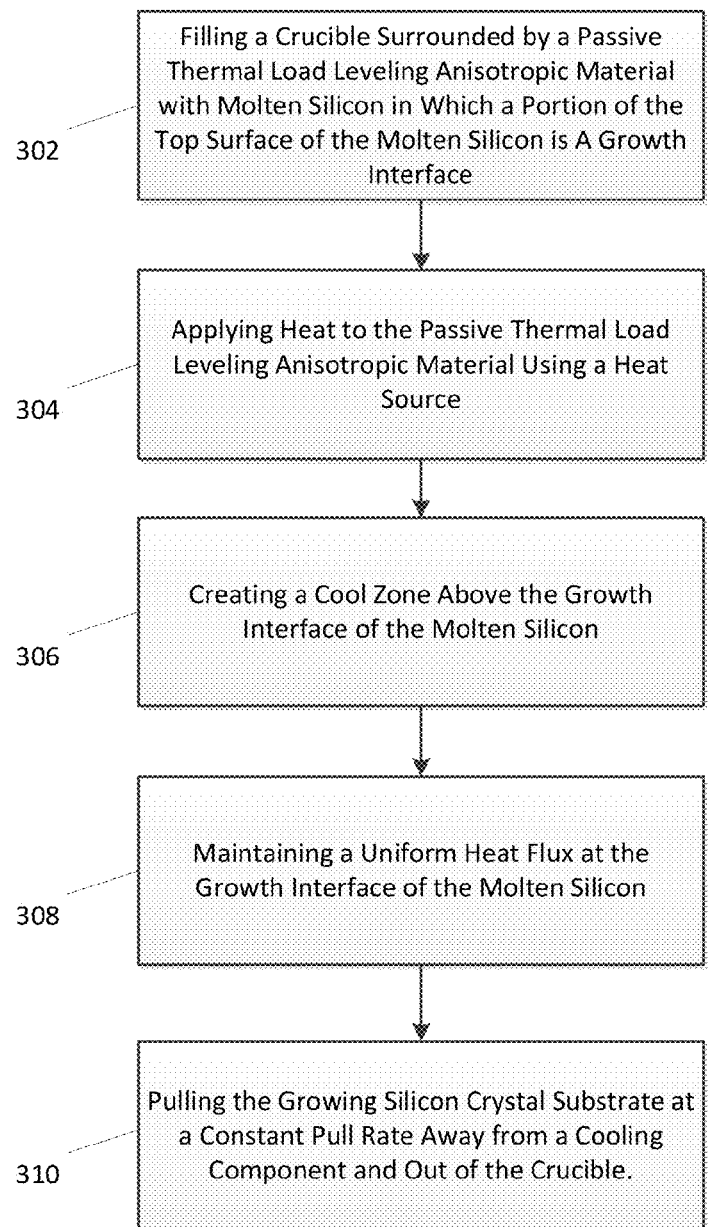
FIG. 3 illustrates a logic flow diagram associated with the apparatus shown in FIG. 1 according to an embodiment of the present disclosure.

FIG. 3 illustrates a logic flow diagram according to an embodiment of the invention. The logic flow 300 may be representative of some or all of the operations executed by apparatuses 100 and/or 200 described herein.

In the illustrated embodiment shown in FIG. 3, the logic flow 300 may fill a crucible 114 with molten silicon 116 at block 302. For example, the crucible 114 may be surrounded by a passive material such as anisotropic thermal load leveling component 112 having a high thermal conductivity. A portion of the top surface of the molten silicon 116 is a growth surface. The embodiments are not limited to this example.

The logic flow 300 may heat the anisotropic thermal load leveling component 112 using a heat source 110 at block 304. For example, the heat source 110 may be comprised of graphite. The embodiments are not limited to this example.

The logic flow 300 may create a cool zone above the growth interface of the molten silicon 116 at block 306. For example, a cold plate component 118 such as, for instance, silicon carbide may be positioned just above the molten silicon 116. The cold plate component 118 may cause the molten silicon 116 to begin solidifying at the growth interface by lowering the temperature at the growth surface to the equilibrium solidification temperature for silicon. The embodiments are not limited to this example.

The logic flow 300 may maintain a uniform heat flux at the growth surface of the molten silicon 116 at block 308. For example, the anisotropic thermal load leveling component 112 uniformly distributes the heat it absorbs from heat source 104 to crucible 114. In turn, the molten silicon 116 within crucible 114 is uniformly maintained such that the heat flux at the growth surface is also uniform. The uniformity may ensure a uniform growth rate for the silicon crystal substrate 120. The embodiments are not limited to this example.

The logic flow 300 may pull or otherwise transport the growing silicon crystal substrate 120 at a constant pull rate away from the crucible 114 at block 310. For example, the growing silicon crystal substrate 120 may be horizontally pulled at a constant rate ($V_x$) away from the cold plate component 118 and out of the crucible 114. The pull rate for silicon crystal substrate 120 may correspond with the growth rate of the silicon crystal substrate 120 such that the thickness ($S_y$) of the silicon crystal substrate 120 is uniform. The silicon crystal substrate 120 may then rest on a support table 122. The embodiments are not limited to this example.

Figure 4:
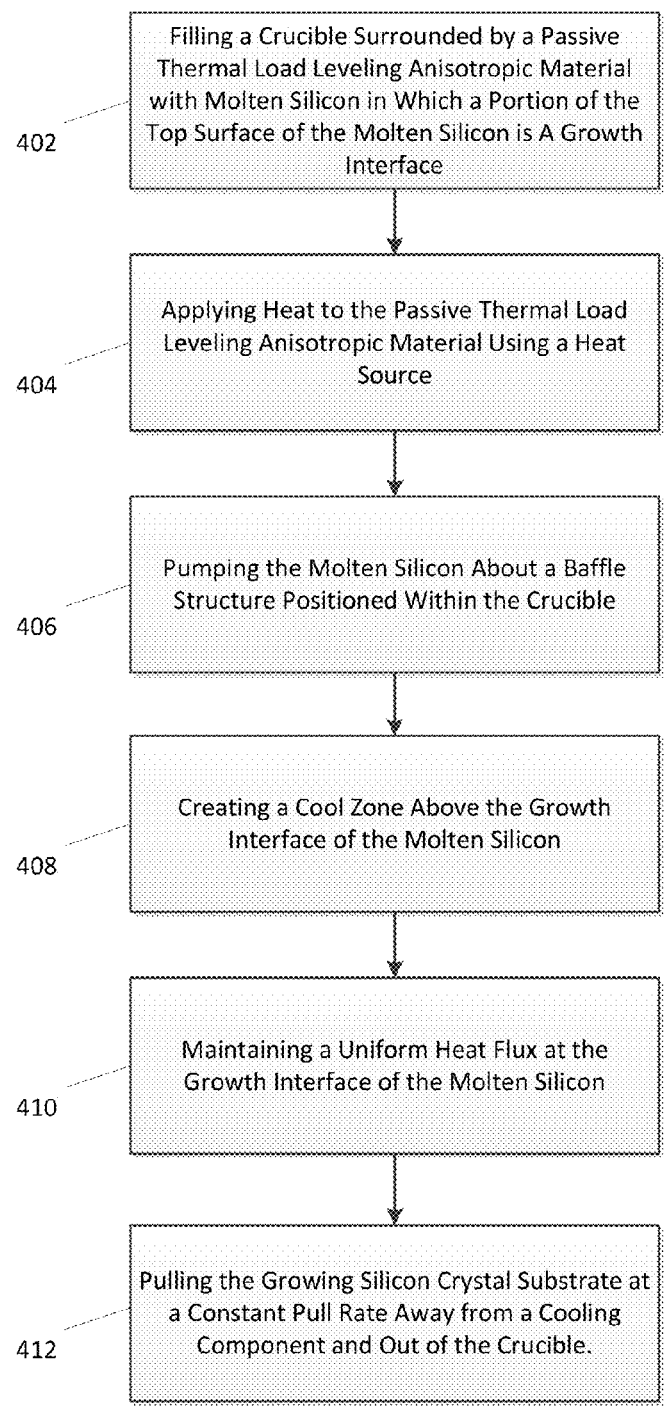
FIG. 4 illustrates a logic flow diagram associated with the apparatus shown in FIG. 2 according to another embodiment of the present disclosure.

FIG. 4 illustrates a logic flow diagram according to an embodiment of the invention. The logic flow 400 may be representative of some or all of the operations executed by apparatuses 100 and/or 200 described herein.

In the illustrated embodiment shown in FIG. 4, the logic flow 400 may fill a crucible 114 with molten silicon 116 at block 402. For example, the crucible 114 may be surrounded by an anisotropic thermal load leveling component 112 having a high thermal conductivity. A portion of the top surface of the molten silicon 116 is a growth surface. The embodiments are not limited to this example.

The logic flow 400 may heat the anisotropic thermal load leveling component 112 using a heat source 110 at block 404. For example, the heat source 110 may be comprised of graphite. The embodiments are not limited to this example.

The logic flow 400 may pump the molten silicon about a baffle structure positioned within the crucible 114 at block 406. For example, a pump 215 may pump the molten silicon 116 about a baffle structure 217 disposed within the crucible 114 has been included. Keeping the molten silicon flowing using the pump 215 may further reduce temperature gradients of the molten silicon 116 leading to a higher quality and more consistent silicon crystal substrate 120 growth. In addition, the constant flow may serve to substantially uniformly disperse any impurities within the molten silicon 116 such that there are no isolated occurrences of high concentrations of impurities that end up in the finished product. The embodiments are not limited to this example.

The logic flow 400 may create a cool zone above the growth interface of the molten silicon 116 at block 408. For example, a cold plate component 118 such as, for instance, silicon carbide may be positioned just above the molten silicon 116. The cold plate component 118 may cause the molten silicon 116 to begin solidifying at the growth interface by lowering the temperature at the growth surface to the equilibrium solidification temperature for silicon. The embodiments are not limited to this example.

The logic flow 400 may maintain a uniform heat flux at the growth surface of the molten silicon 116 at block 410. For example, the anisotropic thermal load leveling component 112 uniformly distributes the heat it absorbs from heat source 104 to crucible 114. In turn, the molten silicon 116 within crucible 114 is uniformly maintained such that the heat flux at the growth surface is also uniform. The uniformity may ensure a uniform growth rate for the silicon crystal substrate 120. The embodiments are not limited to this example.

The logic flow 400 may pull or otherwise transport the growing silicon crystal substrate 120 at a constant pull rate away from the crucible 114 at block 412. For example, the growing silicon crystal substrate 120 may be horizontally pulled at a constant rate ($V_x$) away from the cold plate component 118 and out of the crucible 114. The pull rate for silicon crystal substrate 120 may correspond with the growth rate of the silicon crystal substrate 120 such that the thickness ($S_y$) of the silicon crystal substrate 120 is uniform. The silicon crystal substrate 120 may then rest on a support table 122. The embodiments are not limited to this example.

Figure 5:
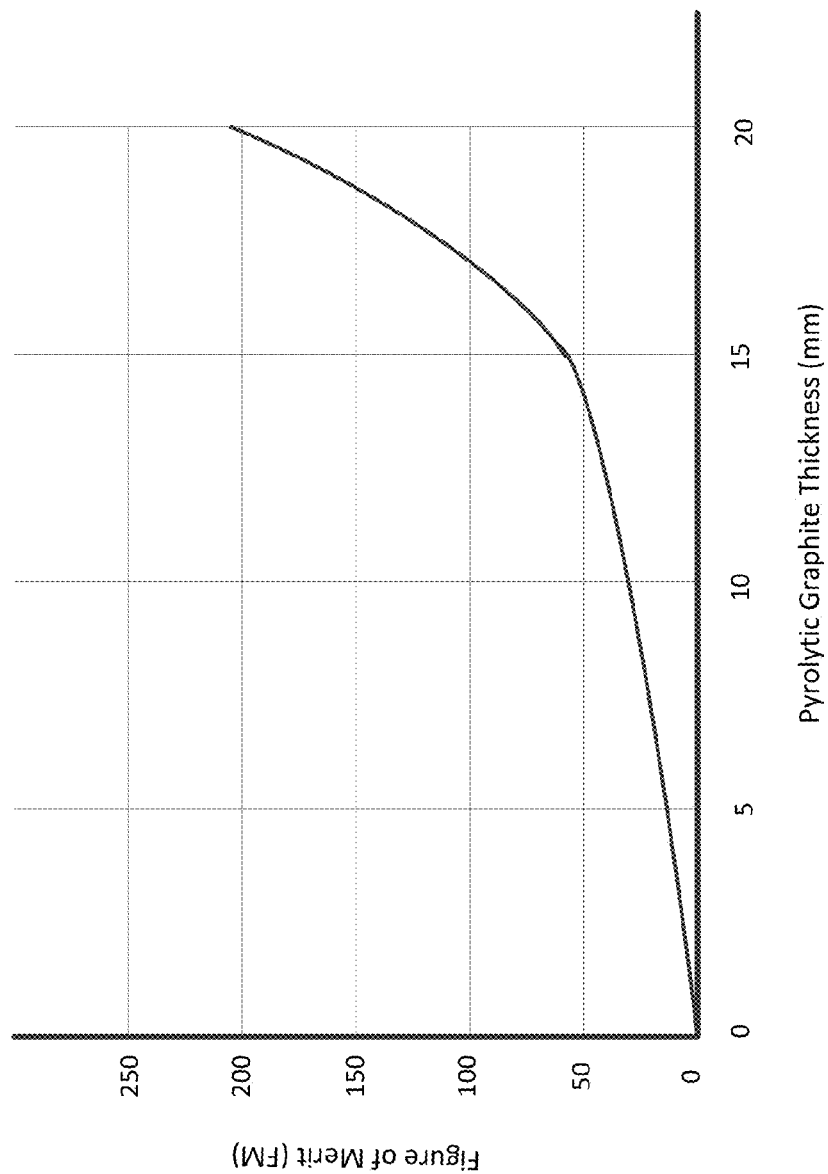
FIG. 5 illustrates a graph depicting a figure of merit (FM) relationship.

FIG. 5 illustrates a graph depicting a figure of merit (FM) relationship. The FM quantifies the uniformity of the heat flux to the lower growth surface (e.g., bottom of growing silicon crystal substrate) given a non-uniform heat source 110. It is defined as the difference between the maximum and minimum heat flux from the heat source surface 110 divided by the difference between the maximum and minimum heat flux to the lower growth surface. It is advantageous to have an FM as large as possible as this indicates that the variation in heat flux to the growth interface is small.

FIG. 5 illustrates the highly nonlinear results of calculations for pyrolytic graphite. The calculations assumed a linear variation in heat flux from the heat source surface. This heat then passed through a layer of pyrolytic graphite ranging in thickness from zero to 20 mm, then through 5 mm of quartz, and finally through 10 mm of molten silicon to the silicon crystal substrate. Each layer was assumed to be 20 cm in length. When the thickness of the pyrolytic graphite is 20 mm the FM is 204 indicating that the variation in heat flux to the substrate was 204 times less than the variation in heat flux from the heater.

Figure 6:
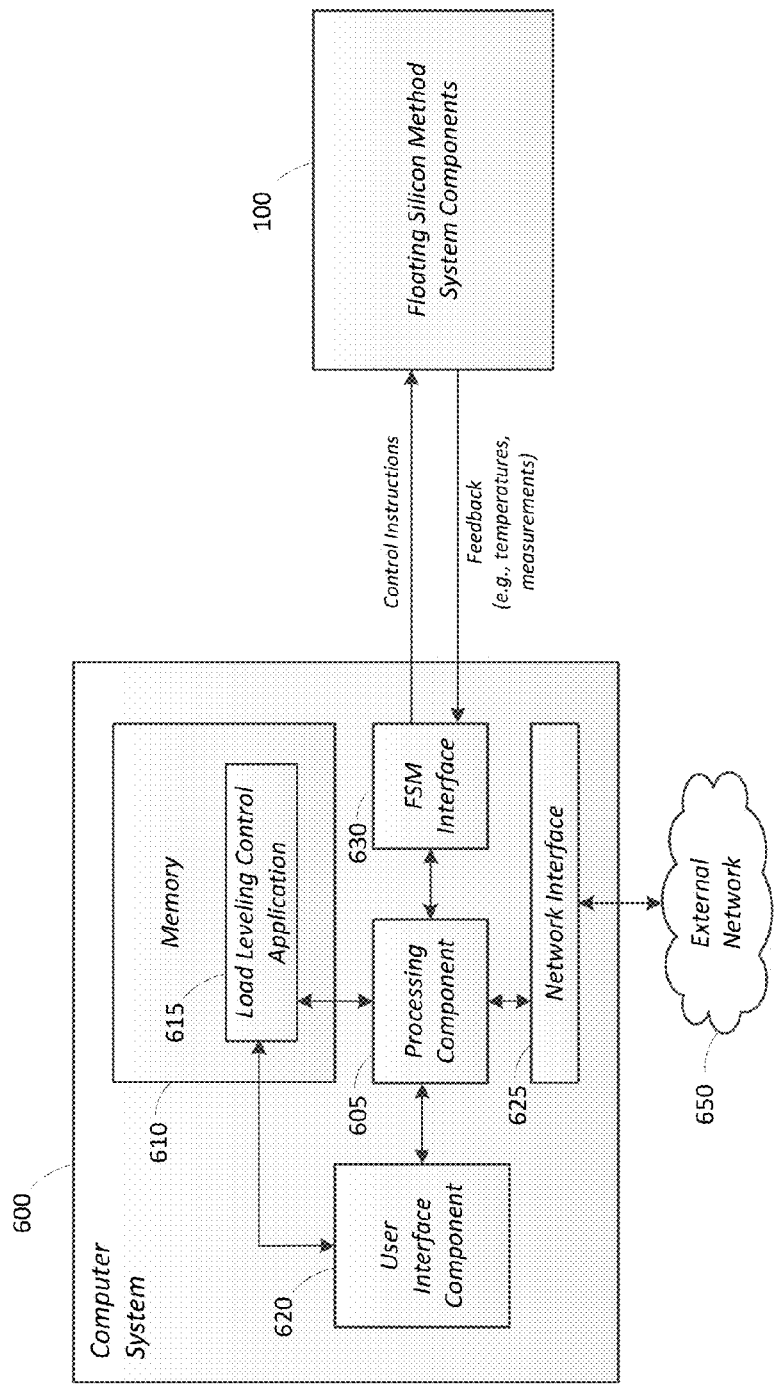
FIG. 6 illustrates an embodiment of an exemplary computer system 600 suitable for implementing various embodiments of the present disclosure.

FIG. 6 illustrates an embodiment of exemplary computer system 600 suitable for implementing the FSM system 100 of FIG. 1 and/or FSM system 200 of FIG. 2. As shown in FIG. 6, the computer system 600 comprises a processing component 605, a system memory 610 storing a load leveling control application 615, a user interface component 620, a network interface 625, and an FSM interface 630. The processing component 605 can be any of various commercially available processors including dual microprocessors and other multi processor architectures. The processing component 605 is communicatively coupled with the other components. In addition, the computer system 600 may be communicatively coupled with an external network 650 via network interface 625.

The computer system 600, via load leveling control application 615, is operative to receive substrate thickness $S_y$ measurements from FSM interface 630. These substrate thickness measurements $S_y$ may be obtained as the silicon crystal substrate is pulled from crucible 114 and may be collected based on sampling times and/or based on the length of substrate pulled from the growth interface. The control application 615 is operative to compare this thickness measurement to predetermined acceptable thickness values stored in memory 610 corresponding to a desired wafer geometry. If the collected thickness values $S_y$ are not within tolerance levels of the predetermined acceptable thickness values stored in memory 610, control application 615 may execute control instructions to adjust the power supplied to heat source 110 and cold plate 118 to modify the temperatures thereof and/or to adjust the pull rate of the silicon crystal substrate pulled from the growth interface onto support table 120. In addition, control application 615 may also alert an operator to adjust the amount of molten silicon 116 within crucible 114. This measurement and parameter modification process may be repeated until a desired thickness of silicon substrate 120 is achieved. Moreover, the use of the anisotropic thermal load leveling component 112 disposed between the heat source 110 and crucible 114 which provides reduces heat flux variations incident on the molten silicon from the heat source may also be considered when implementing these adjustments. Each of these adjustments may be implemented as control instruction executed by load leveling control application 615. In addition, these control instructions may be pre-programmed or may be input by a human operator via a user interface component 620. In this manner, feedback including, but not limited to, various temperature, pull rate, and thickness measurements may be monitored and returned to the computer system 600 for analysis and processing by the load leveling control application 615 to produce a silicon substrate having a desired thickness.

As used herein, the terms "system" and "device" and "component" are intended to refer to a computer-related entity, either hardware, a combination of hardware and software, software, or software in execution, examples of which are provided by the exemplary computing architecture 600. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An apparatus comprising:
a heat source;

a crucible disposed above the heat source and operative to contain molten silicon in which a top surface of the molten silicon is defined as a growth interface;

an anisotropic thermal load leveling component disposed between the heat source and the crucible operative to even-out temperature and heat flux variations emanating from the heat source;

a baffle structure extending from an interior wall of the crucible, the baffle structure having a top surface configured to be entirely submerged within the molten silicon and having a bottom surface disposed above a floor of the crucible; and a pump disposed within the crucible and oriented to direct a flow of the molten silicon over and along the top surface of the baffle structure in a first direction and under and along the bottom surface of the baffle structure in a second direction opposite the first direction.

2. The apparatus of claim 1 wherein the anisotropic thermal load leveling component has a first thermal conductivity in a first direction toward said crucible and a second thermal conductivity in a second direction toward said heat source, the first thermal conductivity is greater than the second thermal conductivity.

3. The apparatus of claim 1 wherein the silicon crystal substrate grows in a direction that is vertically downward from the growth interface.

4. The apparatus of claim 1 wherein the crucible is substantially surrounded by the anisotropic thermal load leveling component.

5. The apparatus of claim 1 wherein the anisotropic thermal load leveling component is a passive component comprised of pyrolytic graphite.

6. The apparatus of claim 5 wherein the pyrolytic graphite is approximately 10 mm thick.

7. The apparatus of claim 1 wherein the crucible is comprised of quartz.

8. The apparatus of claim 7 wherein the quartz is approximately 5 mm thick.

9. The apparatus of claim 1 further comprising a table disposed near an end of the crucible configured to support the silicon crystal substrate as it is pulled from the crucible.

* * * * *